United States Patent
Chu et al.

(10) Patent No.: US 7,020,061 B2
(45) Date of Patent: Mar. 28, 2006

(54) DEVICE AND METHOD FOR PREVENTING EXCESS CURRENT FLOWING INTO PICK-UP HEAD OF OPTICAL STORAGE DEVICE

(75) Inventors: Meng-Huang Chu, Taipei (TW); Meng-Fu Lin, Kaohsiung (TW)

(73) Assignee: VIA Technologies, Inc., Taiepi Hsien (TW)

( * ) Notice: Subject to any disclaimer, the term of this patent is extended or adjusted under 35 U.S.C. 154(b) by 562 days.

(21) Appl. No.: 09/737,103

(22) Filed: Dec. 14, 2000

(65) Prior Publication Data
US 2001/0014068 A1   Aug. 16, 2001

(30) Foreign Application Priority Data
Jan. 28, 2000   (TW) .............................. 89101461 A

(51) Int. Cl.
*G11B 7/00* (2006.01)
(52) U.S. Cl. .............................. 369/53.28; 369/47.51; 369/53.26
(58) Field of Classification Search ............. 369/53.28, 369/116, 44.38, 112.19, 13.31, 112.17, 30.17, 369/44.11, 44.28, 44.29, 44.32; 360/66, 360/67; 361/94, 96, 100, 57
See application file for complete search history.

(56) References Cited

U.S. PATENT DOCUMENTS

| | | | | |
|---|---|---|---|---|
| 4,047,235 A | * | 9/1977 | Davis ......................... | 361/100 |
| 4,682,311 A | * | 7/1987 | Matsubayashi et al. .. | 369/13.31 |
| 5,113,387 A | * | 5/1992 | Goldsmith et al. ....... | 369/44.38 |
| 5,170,389 A | * | 12/1992 | Numata et al. ............. | 369/116 |
| 5,195,012 A | * | 3/1993 | Tripodi ........................ | 361/94 |
| 5,301,080 A | * | 4/1994 | Ottesen et al. ................ | 360/66 |
| 5,802,019 A | * | 9/1998 | Yamada .................... | 369/30.17 |
| 6,157,599 A | * | 12/2000 | Yamashita et al. ....... | 369/44.28 |

* cited by examiner

*Primary Examiner*—William Korzuch
*Assistant Examiner*—Kim-Kwok Chu
(74) *Attorney, Agent, or Firm*—J.C. Patents

(57) ABSTRACT

A method for detecting a current through a pick-up head in an optical storage device. An output value is first set and a root-mean-square value corresponding to the current is further obtained. Next, compute a new value according to the root-mean-square value and a preset value, wherein the preset value is expressed in exponential form and related to an allowable current and a maximum current of the pick-up head. The output value is set as the new value. The pick-up head is shut down if the output value is greater than a threshold value within a sampling number, else repeating the step of obtaining the root-mean-square value.

3 Claims, 1 Drawing Sheet

DEVICE AND METHOD FOR PREVENTING EXCESS CURRENT FLOWING INTO PICK-UP HEAD OF OPTICAL STORAGE DEVICE

CROSS-REFERENCE TO RELATED APPLICATION

This application claims the priority benefit of Taiwan application serial no. 89101461, filed Jan. 28, 2000.

BACKGROUND OF THE INVENTION

1. Field of Invention

The present invention relates to a method of current detection. More particularly, the present invention relates to a method and a device for computing the root-mean-square value of a wave function by sampling the wave function and processing the sampled signals digitally.

2. Description of Related Art

Allowable current and maximum current for the normal operation of a pick-up head system in an optical storage device are normally specified. The optical storage device is for example a CD-ROM device, a CD-R/RW device, a DVD-compatible device. For instance, for model SF-HD2S CD-ROM produced by Sanyo, the allowable current $I_1$ for continuous current is 120 mA rms and the maximum current $I_2$ for a two-second interval cannot exceed 240 mA rms. To prevent unwanted failure of pick-up head due to excess current, a circuit capable of detecting current flow to the pick-up head must be provided. When a current in excess of the maximum allowable current $I_1$, and the maximum current $I_2$ is detected, immediate cutting of current going to the pick-up head is preferred.

The value of the allowable current and the maximum current specified for a particular type of pick-up head is normally in a root-mean-square type. However, a conventional current monitor for a pick-up head normally measures only its DC value. For example, when a wave function is passed into a low-pass filter, the DC value of the wave function is output from the low-pass filter. Hence, a low-pass filter is able to monitor the DC current flowing into the pick-up head. If the measured DC current exceeds a maximum allowable value, current going to the pick-up head can be shut off.

However, DC current and root-mean-square current are two different types of current measurements. It is possible to have a value obtained from a root-mean-square measurement to exceed the maximum allowable current while the value obtained from a DC measurement is still below the maximum. Consequently, the pick-up head may function abnormally leading to a shorter life or premature failure.

SUMNMARY OF THE INVENTION

Accordingly, one object of the present invention is to provide a method capable of preventing the flow of excess current to a pick-up head of an optical device. The method relies on computing the root-mean-square value of a wave function by sampling the wave function and processing the sampled signals digitally.

A second object of this invention is to provide a system capable of preventing the flow of excess current to a pick-up head of an optical device. The system includes an infinite impulse response filter that can compute the root-mean-square value of a wave function. As soon as an output value from the filter exceeds a preset threshold, circuit branch that leads to the pick-up head is immediately cut off to prevent possible damages.

To achieve these and other advantages and in accordance with the purpose of the invention, as embodied and broadly described herein, the invention provides a method for detecting a current through a pick-up head in an optical storage device. An output value is first set and a root-mean-square value corresponding to the current is further obtained. Next, compute a new value according to the root-mean-square value and a preset value, wherein the preset value is expressed in exponential form and related to an allowable current and a maximum current of the pick-up head. The output value is set as the new value. The pick-up head is shut down if the output value is greater than a threshold value within a sampling number, else repeating the step of obtaining the root-mean-square value.

Furthermore, the present invention further provides a system capable of preventing an over-current through a pick-up head of an optical pick-up head. The system comprises a sample-and-square circuit, a computational circuit, a delay circuit, and a threshold detection circuit. The sample-and-square circuit is used for sampling a current through the pick-up head to obtain a root-mean-square value of the current. The computational circuit is used for receiving the root-mean-square value of the current and generating an output. The delay circuit is used for delaying the output from the computational circuit, and feeding back the delayed output to the computational circuit. The threshold detection circuit for preventing the current flowing into the pick-up head when the output from the computational circuit during a sampling interval is greater than a threshold value. The computational circuit generates the output according to the root-mean-square value of the current, a preset value and the delayed output from the delay circuit; the preset value in exponential type is related to an allowable current and a maximum current of the pick-up head.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
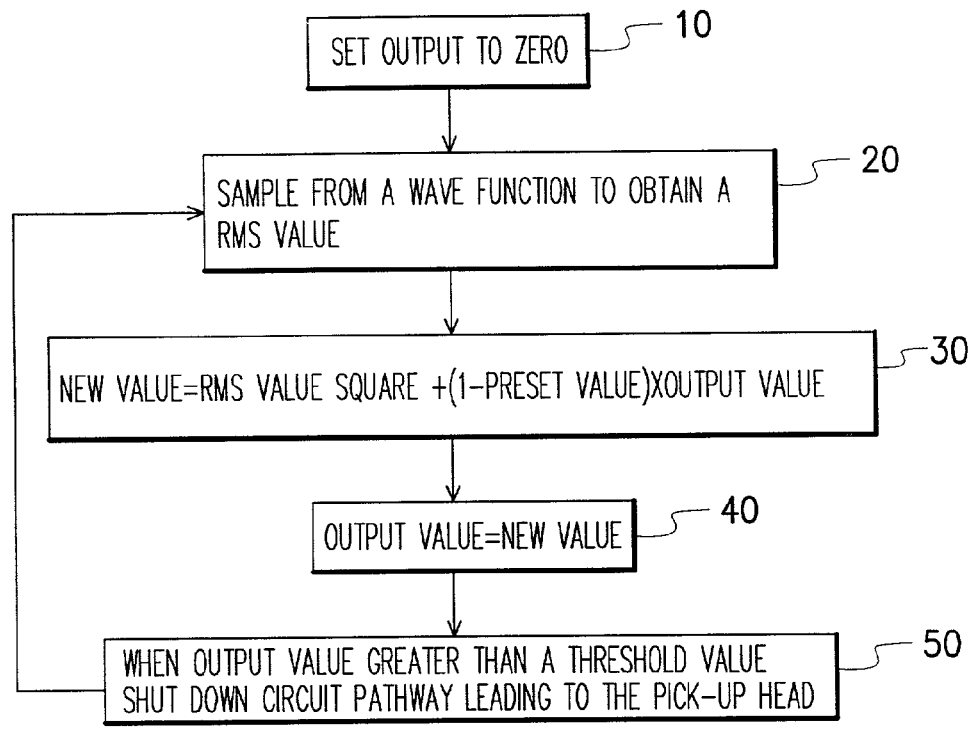
FIG. 1 is a flow chart showing the steps for preventing the flow of excess current into the pick-up head according to this invention.

Reference will now be made in detail to the present preferred embodiments of the invention, examples of which are illustrated in the accompanying drawings. Wherever possible, the same reference numbers are used in the drawings and the description to refer to the same or like parts.

Assume that there is a wave function v(t). The square of root-mean-square value of this wave function is given by:

$$v_{rms}^2(T) = \frac{1}{T}\int_0^T v^2(t)dt \quad (1)$$

Equation (1) is in a continuous-time signal format. In digital signal processing, a discrete time signal of the wave function should be used, and the square of the root-mean-square value is given by:

$$v_{rms}^2(n) = \frac{1}{n}\sum_{k=1}^n v^2(k) \quad (2)$$

In equation (2), n is the number of samples in one cycle. To facilitate computation, if $u_{rms}(n)=v^2_{rms}(n)$ and $u(k)=v^2(k)$, equation (2) can be re-written as:

$$u_{rms}(n) = \frac{1}{n}\sum_{k=1}^n u(k) = \frac{1}{n}\sum_{k=0}^{n-1} u(n-k) \quad (3)$$

A z-transform of equation of (3) is expressed as $$U_{rms}(z) = \frac{1}{n}\sum_{k=0}^{n-1} U(z)\cdot z^{-k} = \frac{1}{n}U(z)\sum_{k=0}^{n-1} z^{-k} \quad (4)$$

In equation (4), U(z) and $U_{rms}(z)$ are z-transform of u(n) and $u_{rms}(n)$ respectively. Expanding equation (4) in the following way:

$$U_{rms}(z) = \frac{1}{n}\sum_{k=0}^{n-1} U(z)\cdot z^{-k} = \frac{U(z)}{n}(1 + z^{-1} + z^{-2} + \ldots + z^{-n+1}) \quad (5)$$

$$= \frac{U(z)}{n}\cdot \frac{1-z^{-n}}{1-z^{-1}}$$

After an inverse z-transform of equation (5) is performed, it becomes:

$$u_{rms}(m) = u_{rms}(m-1) + \frac{u(m) - u(m-n)}{n} \quad (6)$$

Assume that the sampling frequency is $f_s$ so that a sampling interval is $$\frac{1}{f_s}$$

second, the number of samples n taken in t seconds is given by $n=t\cdot f_s$.

Consequently, if equation (6) is used for finding the root-mean-square value, a memory unit capable of holding all the input values within t seconds is needed. In other words, a total of n u values are recorded in each sampling interval. Hence, in a case of high sampling frequency, achieving the aforementioned function is very difficult.

To simplify equation (6), assume that $u(m-n)=q\cdot u_{rms}(m-1)$, equation (6) can be re-written as:

$$u_{rms}(m) = \frac{u(m)}{n} + \left(1 - \frac{q}{n}\right)\cdot u_{rms}(m-1) \quad (7)$$

Assume that all the input values are continuous and fixed, if $u(m)=u_1$, when m $$\to \infty, u_{rms}(m) \to \frac{u_1}{q}.$$

Equation (7) can be further expanded:

$$\begin{aligned}u_{rms}(m) &= \frac{u(m)}{n} + \left(1 - \frac{q}{n}\right)\cdot u_{rms}(m-1) \\ &= \frac{u(m)}{n} + \left(1 - \frac{q}{n}\right)\left[\frac{u(m-1)}{n} + \left(1 - \frac{q}{n}\right)\cdot u_{rms}(m-2)\right] \\ &= \frac{1}{n}\left[u(m) + \left(1 - \frac{q}{n}\right)u(m-1)\right] + \left(1 - \frac{q}{n}\right)^2 u_{rms}(m-2) \\ &= \frac{1}{n}\left[u(m) + \left(1 - \frac{q}{n}\right)u(m-1)\right] + \\ &\quad \left(1 - \frac{q}{n}\right)^2\left[\frac{u(m-2)}{n} + \left(1 - \frac{q}{n}\right)\cdot u_{rms}(m-3)\right] \\ &= \frac{1}{n}\left[u(m) + \left(1 - \frac{q}{n}\right)u(m-1) + \left(1 - \frac{q}{n}\right)^2 u(m-2)\right] + \left(1 - \frac{q}{n}\right)^3 \cdot u_{rms}(m-3) \\ &= \frac{1}{n}\sum_{k=0}^{m-1}\left(1 - \frac{q}{n}\right)^k u(m-k) + \left(1 - \frac{q}{n}\right)^m u_{rms}(0)\end{aligned} \quad (8)$$

If another input u(m) is defined such that when $m \leq 0$, u(m)=0, and when m>0, $u(m)=u_2$ and hence $u_{rms}(0)=0$, equation (8) can be further expanded into:

$$\begin{aligned}u_{rms}(m) &= \frac{u_2}{n}\sum_{k=0}^{m-1}\left(1 - \frac{q}{n}\right)^k \\ &= \frac{u_2}{n}\cdot \frac{1 - \left(1 - \frac{q}{n}\right)^m}{1 - \left(1 - \frac{q}{n}\right)} \\ &= \frac{u_2}{q}\left[1 - \left(1 - \frac{q}{n}\right)^m\right]\end{aligned} \quad (9)$$

Since the allowable continuous current $I_1$ specified in Sanyo's model SF-HD2S is 120 mA rms and the maximum current $I_2$ must not exceed 240 mA rms for two seconds, hence $$\frac{I_1}{I_2} = \frac{1}{2}.$$

In other words, $$\frac{u_1}{u_2} = \left(\frac{I_1}{I_2}\right)^2 = \frac{1}{4}.$$

When m=n, $u_{rms}(m)$ for $I_2$ as input must not exceed the threshold value $$\frac{u_1}{q}$$

for $I_1$ as input. Hence, $$\frac{u_1}{q} = \frac{u_2}{q}\left[1 - \left(1 - \frac{q}{n}\right)^m\right] \quad (10)$$

$$\Rightarrow \frac{1}{4} = 1 - \left(1 - \frac{q}{n}\right)^n$$

$$\Rightarrow q = n \cdot \left(1 - 10^{\frac{\log\frac{3}{4}}{n}}\right) \quad (11)$$

If the sampling rate $f_s$=176400 Hz and sampling interval is 2 seconds, $n = t \cdot f_s = 2 \times 176400 = 352800$. Putting the value into equation (11):

$$q = 0.28768, \quad \frac{n}{q} = 1226354.3$$

To simplify computation, a preset value $$\frac{1}{2^p}$$

can be defined, so that:

$$\frac{q}{n} \leq \frac{1}{2^p} \Rightarrow p = 20$$

In other words, by substituting $$\frac{1}{2^p}$$

for $$\frac{q}{n}$$

in equation (10), the following is obtained:

$$\frac{1}{4} = 1 - \left(1 - \frac{1}{2^{20}}\right)^m \Rightarrow m = \frac{\log\frac{3}{4}}{\log\left(1 - \frac{1}{2^{20}}\right)} = 3016564$$

$$t_2 = \frac{m}{f_s} = \frac{301656.4}{176400} = 1.71 \text{ seconds}.$$

By substituting $$\frac{q}{n}$$

for $$\frac{1}{2^p}$$

in equation (7), it becomes:

$$u_{rms}(m) = \frac{u(m)}{n} + \left(1 - \frac{1}{2^p}\right) \cdot u_{rms}(m-1)$$

If the input is $I_1$, the value of $u_{rms}(m)$ will not exceed the threshold value $$\frac{2^p \cdot u_1}{n}.$$

On the other hand, if the input is $I_2$, the value of $u_{rms}(m)$ will exceed the threshold value $$\frac{2^p \cdot u_1}{n}$$

at 1.7 seconds $$\left(\text{note: } \frac{2^p \cdot u_1}{n} \leq \frac{u_1}{q}\right),$$

and hence the over-current can be detected. The pick-up head can be shut off so that the pick-up head is prevented from over-current.

In this invention, root-mean-square current detection can be implemented by an infinite impulse response IIR filter. The filter makes use of the characteristic equation $$u_{rms}(m) = \frac{u(m)}{n} + \left(1 - \frac{1}{2^p}\right) \cdot u_{rms}(m-1)$$

to obtain the root-mean-square value of a wave function. To avoid division operation, the formula can be modified to $$u_{rms}(m) = u(m) + \left(1 - \frac{1}{2^P}\right) \cdot u_{rms}(m-1),$$

where the threshold value becomes $2^P \cdot u_1$.

FIG. 1 is a flow chart showing the method for preventing an over-current into the pick-up head of a an optical storage device, such as a CD-ROM device, a CD-R/RW device or a DVD compatible device.according to this invention. At a preset sampling frequency, the sampling interval is set. The sampling frequency and the sampling interval are multiplied together to obtain a sampling number. A preset value and a threshold value are then determined according to the allowable current and the maximum current related to the pick-up head.

As shown in FIG. 1, the output value is set to zero (in step 10). A wave function (current flowing to the pick-up head) is sampled to obtain a sample value, and then the sample value is squared (in step 20). A new value is computed using the formula: new value=square of sampled value+(1−set value)×output value (in step 30). The output value is set as the new value(in step 40). When the output value is greater than a threshold value, current flowing to the pick-up head is shut (in step 50). Finally, the step 20 to 50 is repeated again.

Figure 2:
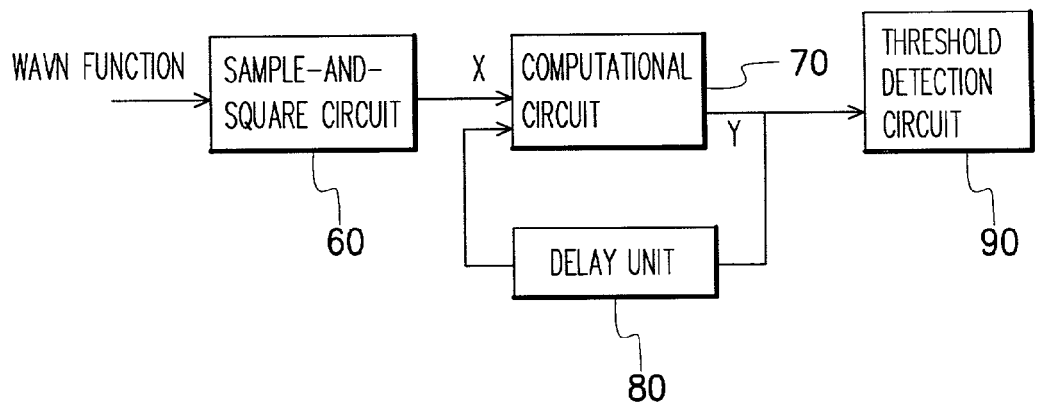
FIG. 2 is a flow chart showing a system capable of preventing the flow of excess current into the pick-up head through detecting the root-mean-square current according to this invention.

FIG. 2 is a block diagram showing a system capable of preventing an over-current into the pick-up head according to this invention. The system includes a sample-and-square circuit 60, a computational circuit 70, a delay unit 80 and a threshold detection circuit 90. The sample-and-square circuit 60 having a sampling frequency f is used for sampling current into the pick-up head. The sampled value is squared inside the circuit 60. The delay unit 80 delays any input value by $$\frac{1}{f}$$

seconds before sending it out. The first input terminal of the computational circuit 70 is coupled to the output terminal of the sample-and-square circuit 60. Another input terminal of the computational circuit 70 is coupled to the output terminal of the delay unit 80. The output terminal of the computational circuit 70 is coupled to the input terminal of the delay unit 80. The computational circuit 70 receives squared sample value from the sample-and-square circuit 60. The computational circuit 70 performs the following calculation: (square sampled value )²+(1−preset value)×(a previous output value of the circuit 70 before a specific time). The resulting new value is output from the computational circuit 70 via its output terminal. The input terminal of the threshold detection circuit 90 is coupled to the output terminal of the computational circuit 70. When the output value from the computational circuit 70 during a sampling interval is greater than a threshold value, the pick-up head is shut off. In general, the preset value and the threshold value are determined from the allowable current related to the pick-up head.

In summary, this invention provides a method for preventing the flow of excess current to the pick-up head by computing the root-mean-square value of a wave function through digital sampling. This invention also provides a system capable of preventing the flow of excess current to the pick-up head. An infinite impulse response filter is used in the system to compute the root-mean-square value of the wave function. When the filter output a value in excess to a preset threshold value, the pick-up head is shut down to protect the pick-up head against possible damages.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A system capable of preventing an over-current through a pick-up head of an optical storage device, comprising:
   a sample-and-square circuit for sampling a current through the pick-up head to obtain a root-mean-square value of the current;
   a computational circuit for receiving the root-mean-square value of the current and generating an output,
   a delay circuit for delaying the output from the computational circuit, and feeding back the delayed output to the computational circuit; and
   a threshold detection circuit for preventing the current flowing into the pick-up head when the output from the computational circuit during a sampling interval is greater than a threshold value,
   wherein the computational circuit generates the output according to the root-mean-square value of the current, a preset value and the delayed output from the delay circuit; the preset value in exponential type is related to an allowable current and a maximum current of the pick-up head.

2. The system of claim 1, wherein the specified period is the reciprocal of a given sampling frequency.

3. The system of claim 1, wherein the sampling number is the product of a given sampling frequency and a preset sampling interval.

* * * * *